US005803967A

United States Patent [19]
Plano et al.

[11] Patent Number: 5,803,967
[45] Date of Patent: Sep. 8, 1998

[54] METHOD OF FORMING DIAMOND DEVICES HAVING TEXTURED AND HIGHLY ORIENTED DIAMOND LAYERS THEREIN

[75] Inventors: Linda S. Plano, Raleigh; Brian R. Stoner, Chapel Hill, both of N.C.

[73] Assignee: Kobe Steel USA Inc., Research Triangle Park, N.C.

[21] Appl. No.: 457,388

[22] Filed: May 31, 1995

[51] Int. Cl.⁶ .................................................. C30B 29/04
[52] U.S. Cl. ........................ 117/102; 117/103; 117/929; 427/590; 423/446
[58] Field of Search .................. 117/929, 102, 117/103; 427/590; 423/446

[56] References Cited

U.S. PATENT DOCUMENTS

| | | | |
|---|---|---|---|
| 4,806,900 | 2/1989 | Fujimori et al. | 338/22 |
| 5,066,938 | 11/1991 | Kobashi et al. | 338/22 |
| 5,086,014 | 2/1992 | Miyata et al. | 437/103 |
| 5,089,802 | 2/1992 | Yamazaki | 338/22 |
| 5,107,315 | 4/1992 | Kumagai et al. | 357/23.15 |
| 5,124,179 | 6/1992 | Garg et al. | 427/402 |
| 5,126,206 | 6/1992 | Garg et al. | 428/408 |
| 5,147,687 | 9/1992 | Garg et al. | 427/590 |
| 5,183,530 | 2/1993 | Yamazaki | 156/643 |
| 5,186,973 | 2/1993 | Garg et al. | 427/590 |

(List continued on next page.)

FOREIGN PATENT DOCUMENTS 59-137396  8/1984  Japan .

OTHER PUBLICATIONS

Stoner et al., Highly Oriented, Textured Diamond Films of Silicon Via Bias–Enhanced Nucleation and Texture Growth, J. Mater. Res., vol. 8, No. 6, Jun. 1993, pp. 1334–1340.

Stoner et al., Bias Assisted Etching of Diamond in a Conventional Chemical Vapor Deposition Reactor, Appl. Phys. Letter 62 (15), 12 Apr. 1993, pp. 1803–1805.

Wild et al., Chemical Vapour Deposition and Characterization of Smooth {100}–Faceted Diamond Films, Diamond and Related Materials, 2, 1993, pp. 158–168.

(List continued on next page.)

*Primary Examiner*—Robert Kunemund
*Attorney, Agent, or Firm*—Myers, Bigel, Sibley & Sajovec

[57] ABSTRACT

A method of forming devices having textured and highly oriented diamond layers includes the steps of forming a plurality of diamond nucleation sites on a substrate and then growing diamond on the sites so merge and form a continuous diamond layer having {100} and {111} facets. The growing step is performed by repeatedly cycling between first growth parameters, which favor growth of the nucleation sites in a direction normal to the {100} facets relative to growth in a direction normal to the {111} facets, and second growth parameters, which favor growth of the {100} facets relative to growth of the {111} facets, in sequence. This is continued until a diamond layer of desired thickness is obtained having large and substantially coplanar {100} facets. The first growth parameters are selected so that the rate of growth of diamond in a direction normal to the exposed {100} facets of the layer is preferably between about one and one quarter (1.25) times and one and three quarter (1.75) times the rate of growth of diamond in a direction normal to the exposed {111} facets of the layer. The second growth parameters are also preferably selected so that the rate of growth of diamond in a direction normal to the exposed {100} facets is between about 0.9 and one and one half (1.5) times the rate of growth of diamond in a direction normal to the exposed {111} facets and more preferably, less than about 1.44 times that rate of growth. The method also includes the step of etching the diamond layer at intermediate stages of the growing step to remove defects therefrom. In particular, the etching step includes the step of etching the diamond layer between cycling from the first growth parameters to the second growth parameters. In accordance with these steps, a textured and highly oriented polycrystalline diamond layer can be achieved having a smooth surface, a high degree of registry between individual grains thereof and electrical properties approaching those of monocrystalline diamond.

29 Claims, 2 Drawing Sheets

U.S. PATENT DOCUMENTS

| | | | |
|---|---|---|---|
| 5,212,401 | 5/1993 | Humphreys et al. | 257/473 |
| 5,221,411 | 6/1993 | Narayan | 156/603 |
| 5,254,862 | 10/1993 | Kalyankjumar et al. | 257/77 |
| 5,278,431 | 1/1994 | Das | 257/77 |
| 5,298,286 | 3/1994 | Yang et al. | 427/429 |
| 5,300,188 | 4/1994 | Tessmer et al. | 156/636 |
| 5,304,461 | 4/1994 | Inoue et al. | 430/323 |
| 5,353,737 | 10/1994 | Koyama et al. | 117/90 |
| 5,358,754 | 10/1994 | Kobashi et al. | 427/577 |
| 5,371,383 | 12/1994 | Miyata et al. | 257/77 |
| 5,391,509 | 2/1995 | Matsukawa et al. | 437/44 |
| 5,391,895 | 2/1995 | Dreifus | 257/77 |
| 5,397,428 | 3/1995 | Stoner et al. | 117/86 |

OTHER PUBLICATIONS

Jiang et al., Heteroepitaxial Diamond Growth on (100) Silicon, Diamond and Related Materials, 2, 1993, pp. 1112–1113.

Cline et al, Cyclic Deposition of Diamond: Experimental Testing of Model Predictions, J. Appl. Phys. 72 (12), 15 Dec. 1992, pp. 5926–5940.

Klages, Chemical Vapor Deposition of Diamond, Appl. Phys. A, 56, 1993, pp. 513–526.

Stoner et al., Textured Diamond Growth on (100) β–SiC Via Microwave Plasma Chemical Vapor Deposition, Appl. Phys. Lett. 60 (6), 10 Feb. 1992, pp. 698–700.

Popovici et al., Nucleation and Selective Deposition of Diamond Thin Films, Phys. Stat. Sol. (a), 132, 1992, pp. 233–252.

Wei et al., Deposition of Diamond Films With Controlled Nucleation and Growth Using Hot Filament CVD, Thin Solid Films, 212, 1992, pp. 91–95.

Geis et al., Large–Area Mosaic Diamond Films Approaching Single–Crystal Quality, Appl. Phys. Letter 58 (22), 3 Jun. 1991, pp. 2485–2487.

Zhu et al., *Growth and Characterization of Diamond Films on Nondiamond Substrates for Electronic Applications*, Proceedings of the IEEE, vol. 79, No. 5, May 1991, pp. 621–646.

Gildenblat et al., *The Electrical Properties and Device Applications of Homoepitaxial and Polycrystalline Diamond Films*, Proceedings of the IEEE, vol. 79, No. 5, May 1991, pp. 647–668.

Kobashi et al., Synthesis of Diamonds by Use of Microwave Plasma Chemical–Vapor Deposition: Morphology and Growth of Diamond Films, Physical Review B, vol. 38, No. 6, 15 Aug. 1988, pp. 4067–4084.

METHOD OF FORMING DIAMOND DEVICES HAVING TEXTURED AND HIGHLY ORIENTED DIAMOND LAYERS THEREIN

FIELD OF THE INVENTION

The present invention relates to methods of forming device containing semiconductor materials, and more particularly, to methods of forming devices containing polycrystalline diamond layers.

BACKGROUND OF THE INVENTION

Electronic devices fabricated from semiconducting diamond offer significant potential for high power and high frequency device applications. This is because diamond possesses a preferred combination of properties such as wide bandgap (5.5 eV), high electron and hole mobility (2000 cm$^2$ V$^{-1}$ sec$^{-1}$), high electron saturation velocity (2×10$^7$ cm sec$^{-1}$) and high breakdown voltage (10$^7$ V cm$^{-1}$), as compared to other conventional semiconductors such as silicon, germanium and gallium arsenide.

Diamond is also a preferred material for mechanical devices because diamond is chemically inert and has high strength properties. Diamond also has the highest thermal conductivity of any solid at room temperature and exhibits good thermal conductivity over a wide temperature range. The high thermal conductivity of diamond may be advantageously used to remove waste heat from an integrated circuit, particularly as integration densities increase. Diamond can also be made electrically insulating. In addition, diamond has a smaller neutron cross-section which reduces its degradation in radioactive environments, i.e., diamond is a "radiation-hard" material.

Because of the advantages of diamond as a material for electronic and mechanical devices, there is continuing interest in the processing of diamond. Diamond may be in the form of either monocrystalline or polycrystalline diamond. In particular, there is an interest in the growth and use of monocrystalline diamond as a material for semiconductor devices. This interest is due in part to the increased efficiency of operation of monocrystalline diamond in comparison to polycrystalline diamond in which surface roughness, grain boundaries and other bulk defects and imperfections can impede the flow of charge carriers and adversely affect material properties such as carrier mobility, trap density and minority carrier lifetimes, etc. Unfortunately, the fabrication of monocrystalline diamond layers is typically carried out by homoepitaxial deposition of semiconducting diamond layers on monocrystalline diamond substrates which are prohibitively expensive for commercial scale process operations. Large monocrystalline diamond substrates may also not be available for many desired applications requiring large surface areas, such as very large scale integrated circuits (VLSI). Accordingly, an economical method is needed for forming polycrystalline diamond layers having electrical and mechanical properties approaching those of monocrystalline diamond.

In particular, there are many mechanical and electrical device applications which can be implemented using thin or thick, defect-free polycrystalline diamond layers having smooth outer surfaces. Such applications include the use of polycrystalline diamond in heat sinks, optical and radiation sensors, vibration/stress sensors, thermistors, Hall sensors, surface acoustic wave (SAW) devices, magnetic field sensors, light emitting and rectifying diodes, electroluminescent devices, field effect transistors, integrated circuits, optical coatings and cutting tools. However, for many of these applications, post deposition techniques to achieve smoothness, such as mechanical or chemical polishing, are not feasible for technical and/or economic reasons. Moreover, because surface roughness and the number of defects in polycrystalline diamond layers typically increase with increased layer thickness and/or reduced nucleation site density, conventional growth techniques may not be suitable for applications requiring thick, high quality diamond layers, for example, for bulk conduction devices and vertical semiconducting devices. Accordingly, the growth of large area polycrystalline diamond layers on nondiamond substrates, which are smooth, defect-free and suitable for both thin and thick film applications, is an important goal if commercial scale fabrication of diamond electrical and mechanical devices is to become a reality.

One attempt to form substantially smooth polycrystalline diamond layers using a patterned polish stopping layer is disclosed in U.S. Pat. No. 5,300,188 to Tessmer et al., entitled *Process for Making Substantially Smooth Diamond*. An attempt to form smooth <100>-textured diamond layers using a two-step deposition process to adjust texture and surface morphology, is disclosed in an article by Wild et al., entitled *Chemical Vapour Deposition and Characterization of Smooth {100}-faceted Diamond Films*, Diamond and Related Materials, Vol. 2, (1993), pp. 158–168. However, the Wild et al. two-step process results in a diamond layer having an unnecessarily large number of defects and a relatively large minimum root mean square (r.m.s.) surface roughness for both thin and thick polycrystalline diamond layers. The diamond layer formed during the first step of the two-step process also has a very large r.m.s. surface roughness and bulk defect density caused, in part, by the use of randomly oriented diamond nuclei. Accordingly, the resulting diamond layer is not preferred for applications requiring low r.m.s. surface roughness and/or bulk conduction as required by vertical diamond semiconducting devices, for example.

An attempt to form large-area diamond films using patterned relief structures in a silicon substrate is disclosed in an article by Geis et al., entitled *Large Area Mosaic Diamond Films Approaching Single-Crystal Quality*, Appl. Phys. Lett. Vol. 58, No. 22, (1991), pp. 2485–2487. An attempt to form highly oriented diamond films on mirror-polished single-crystal (100) silicon by microwave plasma chemical vapour deposition is disclosed in an article by Jiang et al., entitled *Heteroepitaxial Diamond Growth on (100) Silicon*, Diamond and Related Materials, Vol. 2, (1993), pp. 1112–1113. A method of forming polycrystalline diamond films using controlled nucleation and hot filament CVD is also disclosed in an article by Wei et al., entitled *Deposition of Diamond Films With Controlled Nucleation and Growth Using Hot Filament CVD*, Thin Solid Films, Vol. 212, (1992), pp. 91–95.

Notwithstanding these attempts to form polycrystalline diamond layers for electrical and mechanical device applications, there continues to be a need for an economical method of forming smooth, large area polycrystalline diamond layers which do not require chemical or mechanical polishing. There also continues to be a need for a method of forming thick and defect-free polycrystalline diamond layers for devices requiring bulk material properties approaching those of monocrystalline diamond.

SUMMARY OF THE INVENTION

It is therefore an object of the present invention to provide an improved method of forming devices having polycrystalline diamond layers therein.

It is another object of the present invention to provide a method of forming polycrystalline diamond layers having bulk and surface electrical properties approaching those of monocrystalline diamond.

It is a further object of the present invention to provide a method of forming diamond layers having substantially smooth surfaces which do not require chemical or mechanical polishing before subsequent processing.

It is still another object of the present invention to provide a method of forming thin and thick polycrystalline diamond layers which are substantially free of surface and bulk defects.

These and other objects, advantages, and features of the present invention are provided by an improved method of forming diamond devices with <100>-textured and highly oriented polycrystalline diamond layers therein. The method includes the steps of forming a plurality of highly oriented diamond nucleation sites on a substrate and then growing diamond on the sites. During the initial stages of growth, the sites increase in size until they contact adjacent sites and form a continuous diamond layer having {100} and {111} facets. The growing step is then continued by repeatedly cycling between first growth parameters, which favor growth of diamond in a direction normal to the {100} facets relative to growth in a direction normal to the {111} facets, and second growth parameters which are different from the first growth parameters and which are more favorable to growth of the {100} facets relative to growth of the {111} facets, in sequence. In particular, the first growth parameters are utilized in the growth of first diamond layers and the second growth parameters are utilized in the growth of second diamond layers on the first diamond layers. The first growth parameters are also preferably utilized during the initial stages of growing a continuous diamond layer from the nucleation sites.

However, to prevent the formation of buried defects, the first diamond layers are preferably grown to a thickness no greater than about 100 $d_{ns}$ and more preferably, no greater than about 50 $d_{ns}$, where $d_{ns}$ ($\mu$m) is the average distance between adjacent nucleation sites on the substrate. To obtain an r.m.s. surface roughness below about 0.3 $d_{ns}$ and more preferably below about 0.1 $d_{ns}$, and also achieve a low {100} facet tilt misorientation, the second diamond layers are preferably grown to a thickness no greater than about 20 $d_{ns}$ and more preferably, no greater than about 10 $d_{ns}$. The method is complete once a substantially defect-free diamond layer of desired thickness is achieved having a plurality of alternating first and second diamond layers therein and a smooth face with large and substantially coplanar {100} facets. In accordance with the present invention, the resultant diamond layer will have Euler angle grain boundaries of less than about 5° and the <100> directions of the substantially coplanar facets will be tilted with respect to the surface normal of the substrate by less than about 5° and more preferably, less than about 3°.

The first growth parameters are selected so that the rate of growth of diamond in a direction normal to the exposed {100} facets of the layer is preferably between about one and one quarter (1.25) times and one and three quarter (1.75) times the rate of growth of diamond in a direction normal to the exposed {111} facets of the layer. More preferably, the rate of growth of diamond in a direction normal to the exposed {100} facets is greater than about 1.44 times the rate of growth of diamond in a direction normal to the exposed {111} facets, during the first diamond layer forming steps. The second growth parameters are also preferably selected to be different from the first growth parameters and so that the rate of growth of diamond in a direction normal to the exposed {100} facets is between about 0.9 and one and one half (1.5) times the rate of growth of diamond in a direction normal to the exposed {111} facets and more preferably, no greater than about 1.44 times that rate of growth. However, regardless of the first growth parameters and the directional rates of growth achieved therewith, the second growth parameters should be selected to be more favorable to growth of the {100} facets relative to growth of the {111} facets than the first growth parameters. Stated another way, the ratio of the growth rate in a direction normal to the {100} facets to the growth rate in a direction normal to the {111} facets should at least be greater when the first growth parameters are being used than when the second growth parameters are being used.

As will be understood by those skilled in the art, the first and second growth parameters typically include respective time (t), temperature (T °C.), pressure (torr), gas phase composition and flow rate (sccm), power (watts), bias current (I mA) and bias voltage (V) parameters for the particular apparatus being used to grow the diamond layer. In particular, variations in the temperature and gas phase composition typically have the greatest impact on the growth direction and size of the {100} and {111} facets and should be carefully controlled to achieve the above described growth relationships. However, the exact growth parameters to achieve a particular growth rate depend on the particular growth apparatus being used.

The method also includes the step of etching the diamond layer at intermediate stages of the growing step to remove any shallow or surface defects therefrom. In particular, the etching step includes the step of etching the diamond layer between cycling from the first growth parameters to the second growth parameters.

In accordance with these steps, a <100>-textured and substantially defect-free polycrystalline diamond layer can be achieved having a smooth surface, a high degree of registry between individual grains thereof and electrical properties approaching those of monocrystalline diamond. The resulting diamond layer also comprises a plurality of side-by-side columnar monocrystalline diamond grains which extend outwardly from the substrate and are oriented with an azimuthal misorientation of less than about 5° and more preferably, less than about 3° relative to the substrate. Thus, the present invention provides a method of forming diamond devices having diamond layers with bulk and surface electrical properties approaching those of monocrystalline diamond.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to only the embodiments set forth herein. Rather, applicants provide these embodiments so that this disclosure will be thorough and complete, and will fully convey the scope of the invention to those skilled in the art. Like numbers refer to like elements throughout. The thickness of layers and regions are exaggerated for clarity.

Figure 1:
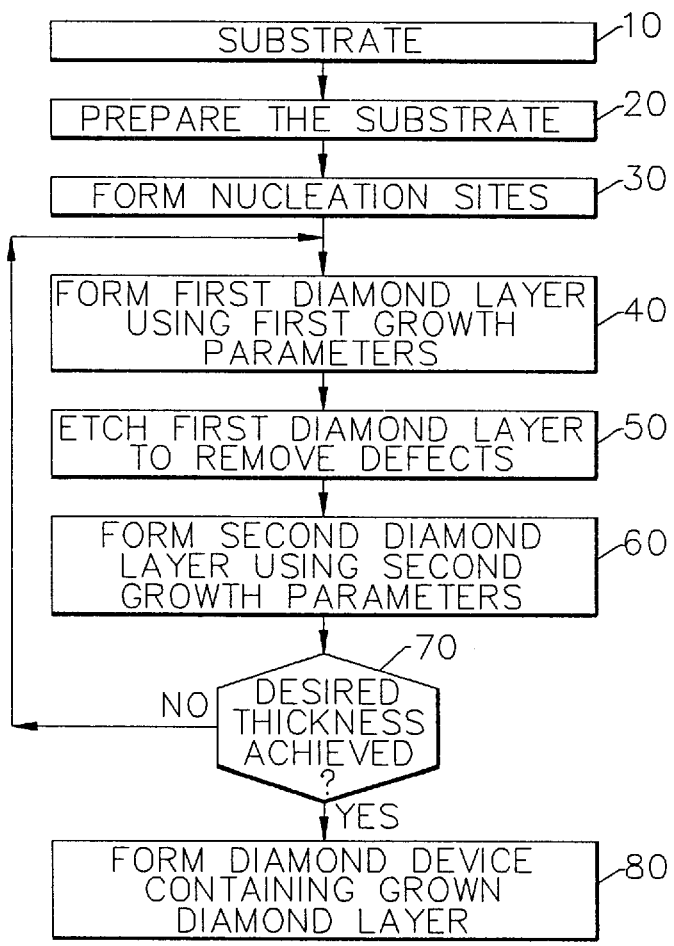
FIG. 1 is a flow-chart of steps corresponding to a preferred method of forming a textured and highly oriented diamond layer.
Figure 2A:
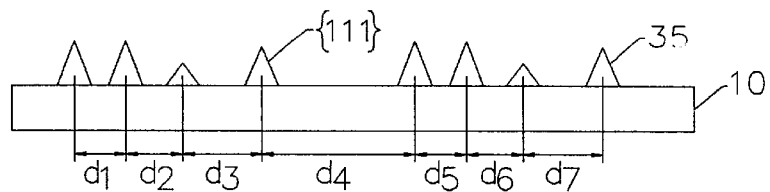
FIGS. 2A–2D illustrate the method of FIG. 1, using greatly enlarged schematic cross-sectional views of a textured and highly oriented polycrystalline diamond layer during intermediate stages thereof.
Figure 2B:
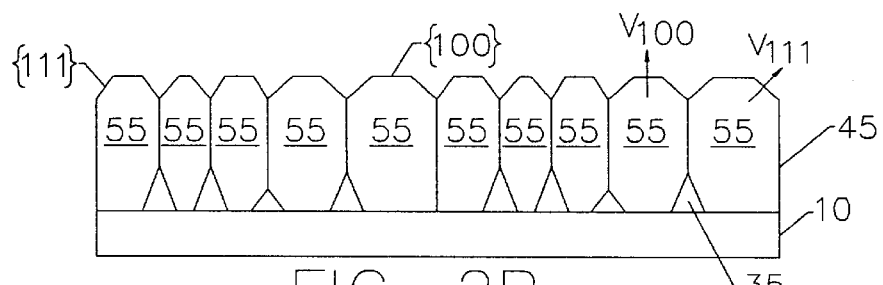
Figure 2C:
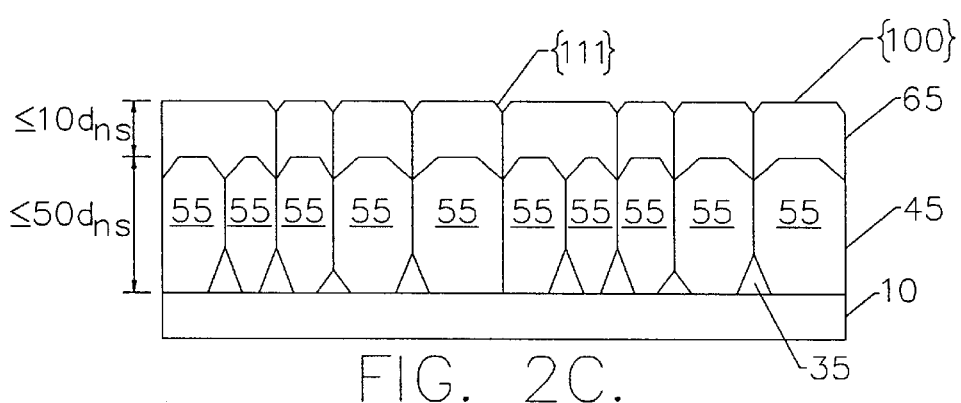
Figure 2D:
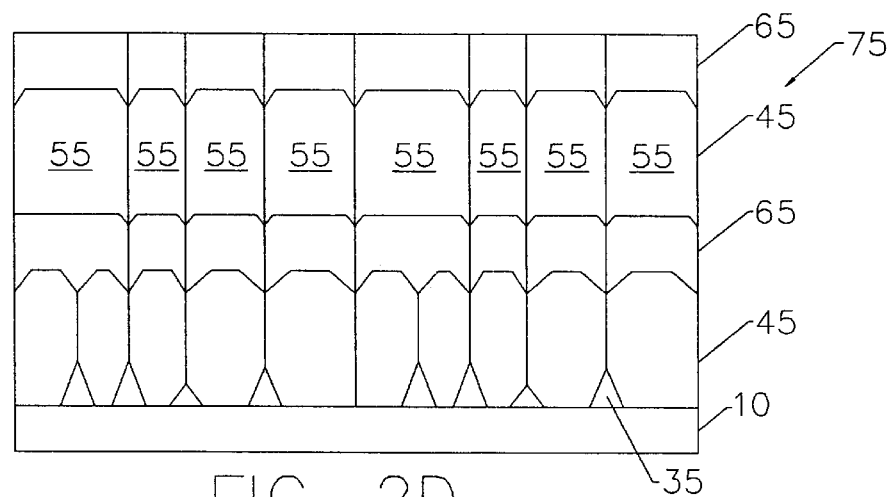

Referring now to FIGS. 1–2, a method of forming a device having a polycrystalline diamond layer therein, will be described. As illustrated, the method includes the steps of providing a suitable substrate 10 on which the polycrystalline diamond layer is to be formed. Suitable substrates may include nondiamond semiconducting substrates such as monocrystalline silicon or others substrates, for example, refractory metals and their carbides. This step is then followed by the steps of preparing 20 the substrate and then forming 30 a plurality of highly oriented diamond nucleation sites 35 on a face of the substrate 10. Preferably, the substrate 10 is prepared 20 for nucleation by carburizing a face of the substrate 10. The step of carburizing the face of the substrate 10 preferably includes the step of forming a epitaxial silicon carbide layer on a silicon substrate, as more fully disclosed in an article by Stoner et al. entitled *Heteroepitaxial Nucleation and Growth of Highly Oriented Diamond Films on Silicon Via In-Situ Carburization and Bias-Enhanced Nucleation*, Proceedings of the 2nd International Conference on the Applications of Diamond Films and Related Materials, MYU, Tokyo, Japan, pp. 825–830 (1993), the disclosure of which is incorporated herein by reference. The nucleation sites 35 are then patterned on the substrate 10 at predetermined locations and orientation. As illustrated, $d_1$, $d_2$, $d_3$, $d_4$, . . . represent the lateral distance between adjacent nucleation sites 35 on the substrate 10. The average distance between adjacent nucleation sites 35 should be kept to within a range of about 0.1–1.0 $\mu$m to help limit the likelihood of bulk defect formation. Randomly patterned and randomly oriented diamond nuclei may also be used, however, the use of random nuclei typically causes a greater number of bulk defects to be present in the resultant diamond layer formed thereon. The formation of thin <100>-textured diamond layers having low r.m.s. surface roughness is also made more difficult using randomly patterned and oriented nuclei. This is because a relatively thick amount of diamond must be grown before the properly oriented crystal grains which stem from the epitaxial nuclei overtake competing adjacent grains.

In particular, the step of nucleating the substrate face may include patterning the substrate face with a two-dimensional array of diamond nucleation sites 35 at predetermined locations. This and other preferred techniques for forming a plurality of diamond nucleation sites on a substrate are disclosed in U.S. Pat. No. 5,397,428 to Stoner et al., entitled *Nucleation Enhancement for Chemical Vapor Deposition of Diamond*, and in copending U.S. application Ser. No. 08/407,096, entitled *Method for Forming Diamond Semiconductor Devices and Layers on Nondiamond Substrates and Structures Formed Thereby* (Attorney Docket No. 5483-6A), the disclosures of which are hereby incorporated herein by reference. Alternative techniques for forming a plurality of diamond nucleation sites on a substrate are also disclosed in articles by Geis et al, entitled *Large-area Mosaic Diamond Films Approaching Single-Crystal Quality*, Appl. Phys. Lett., Vol. 58, No. 22, (1991), pp. 2485–2487, and Popovici et al. entitled *Nucleation and Selective Deposition of Diamond Thin Films*, Phys. Stat. Sol., Vol. 132, (1992), pp. 233–252.

Once a sufficient density of highly oriented nucleation sites 35 (e.g., $10^9$–$10^{10}/\text{cm}^2$) have been formed on the face of the substrate 10, a first diamond layer forming step 40 is performed using first growth parameters. The first growth parameters can include respective time (t), temperature (T °C.), pressure (torr), gas composition and flow rate (sccm), power (watts), bias current (I mA) and bias voltage (V) parameters for the particular apparatus being used to grow the diamond layer, as explained more fully hereinbelow. In particular, the first growth parameters are preferably selected so that the rate of growth of diamond in a direction normal to the exposed {100} facets of the layer (i.e., $V_{100}$) is between about one and one quarter (1.25) times and one and three quarter (1.75) times the rate of growth of diamond in a direction normal to the exposed {111} facets of the layer (i.e., $V_{111}$). More preferably, the first growth parameters are selected so that the rate of growth of diamond in a direction normal to the exposed {100} facets is greater than about 1.44 times the rate of growth of diamond in a direction normal to the exposed {111} facets. Using these parameters, a highly oriented first diamond layer(s) 45 can be formed comprising a plurality of side-by-side columnar monocrystalline diamond grains 55 which extend outwardly from the substrate 10 and are oriented with a tilt and azimuthal misorientation of less than about 5° and more preferably, less than about 3° relative to the substrate.

To achieve these preferred aspects of the present invention, the first diamond layer(s) 45 is typically grown to a thickness of about 10–100 $\mu$m. More preferably, the first diamond layer(s) 45 is grown to a thickness no greater than 100 $d_{ns}$ and more preferably, no greater than 50 $d_{ns}$, where $d_{ns}$ ($\mu$m) is the average distance between adjacent nucleation sites 35 on the substrate 10. Exemplary techniques for forming highly oriented diamond layers with low angle grain boundaries can be found in an article by Stoner et al., entitled *Highly Oriented, Textured Diamond Films On Silicon Via Bias-Enhanced Nucleation and Textured Growth*, J. Mater. Res., Vol. 8, No. 6, (1993), pp. 1334–1340, and in U.S. Pat. Nos. _____, to Dreifus et al., entitled *Microelectronic Structure Having An Array of Diamond Structures on a Nondiamond Substrate and Associated Fabrication Methods* (currently copending application Ser. No. 08/035,643 (Attorney Docket No. 5483-6)), and 5,371,383 to Miyata et al., entitled *Highly Oriented Diamond Film Field-Effect Transistor*, the disclosures of which are hereby incorporated herein by reference.

An etching step 50 can also be performed to remove defects from the first diamond layer(s) 45, but not appreciably reduce the thickness of the first diamond layer 45. This step is particularly useful at eliminating defects when randomly oriented diamond nuclei have been used to initiate growth. As illustrated, the etching step 50 is a separate and distinct step having respective etching parameters. However, as will be understood by those skilled in the art, the etching step 50 may also be performed during a changeover from the first growth parameters to the second growth parameters, as explained more fully hereinbelow. The etching step may also be eliminated if the first growth parameters result in a substantially defect free first diamond layer(s) 45. Preferred techniques for etching diamond are disclosed in an article by Stoner et al., entitled *Bias Assisted Etching of Diamond In a Conventional Chemical Vapor Deposition Reactor*, Appl. Phys. Lett. Vol. 62, No. 15, (1993), pp. 1803–1805, and in copending application Ser. No. 08/223,521 to Tessmer et al., entitled *Method for Etching a Diamond Film* (Attorney Docket No. 5483-46), the disclosures of which are hereby incorporated herein by reference.

After the first diamond layer 45 is formed, a second diamond layer forming step using second growth parameters is performed, Block 60. This step is performed to increase the size of the {100} facets of the first diamond layer(s) 45 and fill in any small voids between adjacent {111} facets, but not appreciably increase the degree of tilt of the {100} facets relative to the face of the substrate 10 or the degree of azimuthal misorientation of the grains relative to the substrate lattice. To achieve this, the second growth parameters are preferably selected so that the rate of growth of diamond in a direction normal to the exposed {100} facets ($V_{100}$) is between about 0.9 and one and one half (1.5) times the rate of growth of diamond in a direction normal to the exposed {111} facets ($V_{111}$) and more preferably, no greater than about 1.44 times that rate of growth. Accordingly, is it not absolutely necessary to reduce $V_{100}$ below $V_{111}$ to achieve increased {100} facet size and improve the smoothness of the face of the second diamond layer 65. It is also not necessary to reduce $V_{100}$ below $V_{111}$ to achieve favored growth of the {100} facets ($\mu m^2$/hr) at a higher rate than the {111} facets. However, the second growth parameters should be adjusted relative to the first growth parameters to cause the ratio of $V_{100}/V_{111}$ during the second diamond layer forming step to be below the ratio of $V_{100}/V_{111}$ achieved during the first diamond layer forming step.

Because variations in the temperature and gas phase composition typically have the greatest impact on the growth direction and size of the {100} and {111} facets, these growth parameters should be carefully controlled to achieve the above described growth velocity relationships. In particular, these preferred relative growth velocities can be achieved in reactors using carbon and oxygen containing gas compositions, by increasing the atomic oxygen to carbon ratio when switching from the first growth parameters to the second growth parameters and/or by reducing the temperature in the reactor during the second diamond layer forming step. Typically, the atomic oxygen to carbon ratio of the carbon containing gas composition is increased by about 50% or more when switching from the first growth parameters to the second growth parameters.

To obtain an r.m.s. surface roughness below about 0.3 $d_{ns}$ and more preferably, below about 0.1 $d_{ns}$, and to achieve a low {100} facet tilt, the second diamond layer(s) 65 is preferably grown to a thickness between about 2–20 ($\mu$m) or even less. More preferably, the second diamond layer(s) 65 is grown to a thickness no greater than about 20 $d_{ns}$ and more preferably, no greater than about 10 $d_{ns}$. The first and second diamond layer forming steps are then repeated until a polycrystalline diamond layer 75 having a desired thickness for subsequent processing is obtained and the query 70 whether the desired thickness has been achieved is answered "yes". If the answer is "no", then steps 40–60 are repeated. However, based on simulations by the inventors herein, to obtain a substantially defect free diamond layer having a r.m.s. surface roughness below about 0.3 $d_{ns}$, it is preferable to grow the diamond layer 75 by repeating three or more cycles of growth using the first and second growth parameters in sequence. Thus, to obtain a resulting diamond layer which is thin, it may be necessary to grow the first and second diamond layers at thicknesses substantially below the 50 $d_{ns}$ and 10 $d_{ns}$ thicknesses, respectively.

The method can also include the step of forming 80 an electrical or mechanical diamond device such as an optical or radiation sensor, vibration/stress sensor, thermistor, Hall sensor, surface acoustic wave (SAW) device, magnetic field sensor, light emitting or rectifying diode, electroluminescent device, field effect transistor, integrated circuit, or cutting tool, from the substantially defect-free diamond layer 75. Accordingly, the resulting diamond device will comprise a polycrystalline diamond layer 75 having Euler angle grain boundaries of less than about 5°. The <100> directions of the substantially coplanar {100} facets of the layer 75 will also be tilted with respect to the surface normal of the substrate by less than about 5° and more preferably, less than about 3°. The azimuthal misorientation of the columnar grains 55 of the layer 75 will also be less than about 5° and more preferably, less than about 3° relative to the substrate.

EXAMPLE

The following example is illustrative of a preferred method of forming a <100>-textured and highly oriented diamond layer having a plurality of first and second layers therein, according to the present invention. In particular, the following first and second growth parameters illustrated in Tables 1 and 2, respectively, were selected for a NIRIM style microwave-tube PECVD reactor having a 1.5" inner diameter tube. These parameters were used to grow a diamond layer 75 on a silicon substrate having an average diamond nucleation site density of about $10^{10}/cm^2$ thereon, with more than 50% of the sites being epitaxial to the substrate. Based on these growth parameters, a substantially defect-free diamond layer 75 having a surface roughness of less than about 0.15 $\mu$m was achieved with tilt and azimuthal misorientations of less than 3°. As would be understood by those skilled in the art, however, alternative growth parameters for the first and second diamond layer forming steps could also be used, particularly if another type of reactor is employed.

TABLE I

| PARAMETER | VALUE | UNITS |
|---|---|---|
| TIME | 18 | hrs. |
| PRESSURE | 60 | Torr |
| TEMP | 830 | °C. |
| FORWARD POWER | 540 | Watts |
| REVERSE POWER | 99 | Watts |
| SEPARATION | −2.8 | cm |
| THICKNESS | 10 | $\mu$m |
| GAS1≡H$_2$ | 86.8 | sccm |
| GAS2≡CH$_4$ | 10.50 | sccm |
| GAS3≡O$_2$ | 2.70 | sccm |

TABLE II

| PARAMETER | VALUE | UNITS |
|---|---|---|
| TIME | 5 | hrs. |
| PRESSURE | 60 | Torr |
| JEMP | 800 | °C. |
| FORWARD POWER | 400 | Watts |
| REVERSE POWER | 70 | Watts |
| SEPARATION | −2.8 | cm |
| THICKNESS | 0.5 | $\mu$m |
| GAS1≡H$_2$ | 98.2 | sccm |
| GAS2≡CH$_4$ | 1.23 | sccm |
| GAS3≡O$_2$ | 0.56 | sccm |

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method of forming a polycrystalline diamond layer, comprising the steps of:
   (a) forming a plurality of diamond nucleation sites on a substrate;
   (b) forming a first diamond layer, having {100} and {111} facets at an exposed face thereof, by growing diamond on the nucleation sites using first growth parameters which favor growth of diamond in a direction normal to the respective {100} facets relative to growth of diamond in a direction normal to the respective {111} facets;
   (c) etching the first diamond layer at the exposed face to remove defects therefrom;
   (d) forming a second diamond layer, having {100} and {111} facets at an exposed face thereof, on the etched first diamond layer, by growing diamond using second growth parameters which favor growth of the respective {100} facets of the second diamond layer relative to growth of the respective {111} facets of the second diamond layer, and wherein a ratio which equals a rate of growth of diamond in a direction normal to the respective {100} facets relative to a rate of growth of diamond in a direction normal to the respective {111} facets during the first diamond layer forming step is greater than a ratio which equals a rate of growth of diamond in a direction normal to the respective {100} facets relative to a rate of growth of diamond in a direction normal to the respective {111} facets during the second diamond layer forming step; and
   (e) repeating steps (b), (c) and (d) in sequence at least once to obtain a polycrystalline diamond layer having a plurality of alternating first and second diamond layers therein.

2. The method of claim 1, wherein said repeating step includes repeating steps (b), (c) and (d) in sequence at least once to obtain a polycrystalline diamond layer having a generally smooth outermost face and a plurality of side-by-side columnar monocrystalline diamond grains which extend outwardly from the substrate to the outermost face and have {100} facets with tilt misorientations of less than 5° relative to the substrate.

3. The method of claim 1, wherein during said first diamond layer forming step, the rate of growth of diamond in the direction normal to the respective {100} facets of the first diamond layer is greater than about one and one quarter times the rate of growth of diamond in the direction normal to the respective {111} facets of the first diamond layer.

4. The method of claim 3, wherein during said second diamond layer forming step, the rate of growth of diamond in a direction normal to the respective {100} facets of the second diamond layer is less than about one and one half times the rate of growth of diamond in a direction normal to the respective {111} facets of the second diamond layer.

5. The method of claim 4, wherein during said first diamond layer forming step, the rate of growth of diamond in the direction normal to the respective {100} facets of the first diamond layer is greater than about 1.44 times the rate of growth of diamond in the direction normal to the respective {111} facets of the first diamond layer, and wherein during said second diamond layer forming step, the rate of growth of diamond in the direction normal to the respective {100} facets of the second diamond layer is less than about 1.44 times the rate of growth of diamond in the direction normal to the respective {111} facets of the second diamond layer.

6. The method of claim 5, wherein during said first diamond layer forming step, the rate of growth of diamond in the direction normal to the respective {100} facets of the first diamond layer is less than about 1.75 times the rate of growth of diamond in the direction normal to the respective {111} facets of the first diamond layer, and wherein during said second diamond layer forming step, the rate of growth of diamond in the direction normal to the respective {100} facets of the second diamond layer is greater than about 0.9 times the rate of growth of diamond in the direction normal to the respective {111} facets of the second diamond layer.

7. The method of claim 4, wherein the substrate is a monocrystalline semiconductor substrate and wherein substantially all of the columnar monocrystalline diamond grains have an azimuthal misorientation of less than about 5° relative to the monocrystalline semiconductor substrate.

8. The method of claim 1, wherein said nucleation site forming step comprises forming an array of highly oriented nucleation sites having an average spacing distance therebetween, and wherein said repeating step comprises repeating steps (b), (c) and (d) in sequence at least once to obtain a polycrystalline diamond layer having an r.m.s. surface roughness of below about 0.3 times the average spacing distance.

9. The method of claim 1, wherein said nucleation site forming step comprises forming an array of highly oriented nucleation sites having an average spacing distance therebetween, wherein said first diamond layer forming step comprises forming a first diamond layer having a thickness of less than about 100 times the average spacing distance, wherein said second diamond layer forming step comprises forming a second diamond layer having a thickness of less than about 20 times the average spacing distance, and wherein said repeating step comprises repeating steps (b), (c) and (d) in sequence at least once to obtain a polycrystalline diamond layer having an r.m.s. surface roughness of below about 0.3 times the average spacing distance.

10. A method of forming a diamond layer on a semiconductor substrate, comprising the steps of:
   forming a first diamond layer, having {100} and {111} facets at an exposed face thereof, by growing diamond on the substrate using first growth parameters which favor growth of diamond in a direction normal to the respective {100} facets relative to growth of diamond in a direction normal to the respective {111} facets;
   forming a second diamond layer, having {100} and {111} facets at an exposed face thereof, on the first diamond layer, by growing diamond using second growth parameters which favor growth of the respective {100} facets of the second diamond layer relative to growth of the respective {111} facets of the second diamond layer, and wherein a ratio which equals a rate of growth of diamond in a direction normal to the respective {100} facets relative to a rate of growth of diamond in a direction normal to the respective {111} facets during the first diamond layer forming step is greater than a ratio which equals a rate of growth of diamond in a direction normal to the respective {100} facets relative to a rate of growth of diamond in a direction normal to the respective {111} facets during the second diamond layer forming step; and
   repeating said first and second diamond layer forming steps in sequence at least once to obtain a diamond layer which has an outermost face and comprises a plurality of side-by-side columnar monocrystalline diamond grains extending outwardly from the semiconductor substrate to the outermost face.

11. The method of claim 10, wherein said second diamond layer forming step is preceded by the step of etching the first diamond layer to remove defects therefrom; wherein said repeating step comprises the step of repeating said first diamond layer forming step, said etching step and said second diamond layer forming step in sequence at least once to obtain a polycrystalline diamond layer comprising a plurality of side-by-side columnar monocrystalline diamond grains which extend outwardly from the semiconductor substrate to the outermost face; wherein substantially all of the {100} facets of the polycrystalline diamond layer have a tilt misorientation of less than about 5°; and wherein substantially all of the columnar monocrystalline diamond grains have an azimuthal misorientation of less than about 5° relative to the semiconductor substrate.

12. The method of claim 10, wherein during said first diamond layer forming step, the rate of growth of diamond in the direction normal to the respective {100} facets of the first diamond layer is greater than about one and one quarter times the rate of growth of diamond in the direction normal to the respective {111} facets of the first diamond layer.

13. The method of claim 12, wherein during said second diamond layer forming step, the rate of growth of diamond in a direction normal to the respective {100} facets of the second diamond layer is less than about one and one half times the rate of growth of diamond in a direction normal to the respective {111} facets of the second diamond layer.

14. The method of claim 13, wherein during said first diamond layer forming step, the rate of growth of diamond in the direction normal to the respective {100} facets of the first diamond layer is less than about one and three quarter times the rate of growth of diamond in the direction normal to the respective {111} facets of the first diamond layer.

15. The method of claim 12, wherein during said second diamond layer forming step, a rate of growth of diamond in a direction normal to the respective {100} facets of the second diamond layer is between about 0.9 and 1.44 times a rate of growth of diamond in a direction normal to the respective {111} facets of the second diamond layer.

16. The method of claim 11, wherein during said first diamond layer forming step, the rate of growth of diamond in the direction normal to the respective {100} facets of the first diamond layer is between about one and one quarter and one and three quarter times the rate of growth of diamond in the direction normal to the respective {111} facets of the first diamond layer.

17. The method of claim 16, wherein said first diamond layer forming step is preceded by the step of carburizing a face of the monocrystalline nondiamond substrate and nucleating the carburized substrate face with diamond; and wherein said first diamond layer forming step comprises growing a first diamond layer on the nucleated diamond.

18. The method of claim 10, wherein said first diamond layer forming step is preceded by the step of forming an array of highly oriented diamond nucleation sites having an average spacing distance therebetween, and wherein an r.m.s. surface roughness of the diamond layer is below about 0.3 times the average spacing distance.

19. The method of claim 10, wherein said first diamond layer forming step is preceded by the step of forming an array of highly oriented diamond nucleation sites having an average spacing distance therebetween, wherein a thickness of the plurality of first diamond layers is less than about 50 times the average spacing distance, wherein a thickness of the plurality of second diamond layers is less than about 10 times the average spacing distance.

20. A method of forming a highly oriented polycrystalline diamond layer, comprising the steps of:

forming a plurality of noncontacting diamond nucleation sites having respective {100} and {111} facets on a monocrystalline semiconductor substrate; and growing a diamond layer on the nucleation sites by repeatedly cycling between first growth parameters, which favor growth of the nucleation sites in a direction normal to the {100} facets relative to growth in a direction normal to the {111} facets, and second growth parameters, at least one of which is different from said first growth parameters, which favor growth of the {100} facets relative to growth of the {111} facets, in sequence, until a highly oriented polycrystalline diamond layer is formed comprising a plurality of side-by-side columnar monocrystalline diamond grains which extend outwardly from the monocrystalline semiconductor substrate and are oriented with a tilt and azimuthal misorientation of less than about 5° relative to the monocrystalline semiconductor substrate; and wherein during said first diamond layer forming step, a rate of growth of diamond in the direction normal to the respective {100} facets of the first diamond layer is greater than about 1.44 times a rate of growth of diamond in the direction normal to the respective {111} facets of the first diamond layer, and wherein during said second diamond layer forming step, a rate of growth of diamond in the direction normal to the {100} facets of the second diamond layer is less than about 1.44 times a rate of growth of diamond in the direction normal to the respective {111} facets of the second diamond layer.

21. The method of claim 20, wherein said nucleation site forming step is preceded by the step of carburizing a face of the monocrystalline substrate.

22. The method of claim 20, wherein said diamond growing step comprises the step of etching the polycrystalline diamond layer to remove defects therefrom at least once before the cycling between the first growth parameters and the second growth parameters.

23. A method of forming a polycrystalline diamond layer on a silicon substrate, comprising the steps of:

(a) carburizing a monocrystalline silicon substrate to form an epitaxial silicon carbide layer thereon;

(b) forming a plurality of diamond nucleation sites having an average spacing distance therebetween, on the epitaxial silicon carbide layer;

(c) forming a first diamond layer having a thickness less than 50 times the average spacing distance and having {100} and {111} facets at an exposed face thereof, by growing diamond on the nucleation sites using first growth parameters which cause a rate of growth of diamond in a direction normal to the respective {100} facets of the first diamond layer to be greater than about 1.44 times a rate of growth of diamond in a direction normal to the respective {111} facets of the first diamond layer;

(d) forming a second diamond layer having a thickness less than about 20 times the average spacing distance and having {100} and {111} facets at an exposed face thereof, on the first diamond layer, by growing diamond using second growth parameters which cause a rate of growth of diamond in a direction normal to the respective {100} facets of the second diamond layer to be less than 1.44 times a rate of growth of diamond in a direction normal to the respective {111} facets of the second diamond layer; and (e) repeating steps (c) and (d) in sequence at least once to obtain a polycrystalline diamond layer having a plurality of alternating first and second diamond layers therein.

24. The method of claim 23, wherein said first growth parameters include a first gas phase composition comprising carbon and oxygen containing gases, wherein said second growth parameters include a second gas phase composition comprising carbon and oxygen containing gases, and wherein a ratio of oxygen atoms to carbon atoms in said second gas phase composition is greater than about 1.5 times a ratio of oxygen atoms to carbon atoms in said first gas phase composition.

25. The method of claim 24, wherein said repeating step comprises repeating steps (c) and (d) in sequence at least twice to obtain a polycrystalline diamond layer having an r.m.s. surface roughness of below about 0.3 times the average spacing distance.

26. The method of claim 24, wherein said first and second growth parameters include first and second process temperatures, respectively, and wherein said first process temperature is within 50° C. of said second process temperature.

27. The method of claim 26, wherein said second process temperature is less than said first process temperature.

28. A diamond device comprising:

a substrate;

a plurality of diamond nucleation sites on said substrate having an average spacing distance therebetween;

a highly oriented polycrystalline diamond layer on said diamond nucleation sites and having {100} facets with a tilt misorientation of less than about 5° relative to a surface normal of said substrate and an r.m.s. surface roughness of below about 0.3 times the average spacing distance, said highly oriented diamond layer comprising a plurality of alternating first and second diamond layers therein which have thicknesses less than about 50 times and about 10 times the average spacing distance, respectively.

29. The device of claim 28, wherein said highly oriented diamond layer has an outermost face and comprises a plurality of side-by-side columnar monocrystalline diamond grains extending from said substrate to the outermost face, and wherein an azimuthal misorientation of said grains is less than about 5°.

* * * * *